United States Patent
Elam et al.

(10) Patent No.: US 12,006,570 B2
(45) Date of Patent: Jun. 11, 2024

(54) ATOMIC LAYER DEPOSITION FOR CONTINUOUS, HIGH-SPEED THIN FILMS

(71) Applicant: UCHICAGO ARGONNE, LLC, Chicago, IL (US)

(72) Inventors: Jeffrey W. Elam, Elmhurst, IL (US); Joseph A. Libera, Clarendon Hills, IL (US); Angel Yanguas-Gil, Northbrook, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 149 days.

(21) Appl. No.: 16/105,432

(22) Filed: Aug. 20, 2018

(65) Prior Publication Data

US 2019/0062912 A1 Feb. 28, 2019

Related U.S. Application Data

(60) Provisional application No. 62/553,107, filed on Aug. 31, 2017.

(51) Int. Cl.
| | | |
|---|---|---|
| C23C 16/455 | (2006.01) | |
| C23C 16/40 | (2006.01) | |
| C23C 16/52 | (2006.01) | |
| C23C 16/54 | (2006.01) | |

(52) U.S. Cl.
CPC ........ C23C 16/45527 (2013.01); C23C 16/40 (2013.01); C23C 16/45551 (2013.01); C23C 16/45553 (2013.01); C23C 16/45555 (2013.01); C23C 16/45574 (2013.01); C23C 16/52 (2013.01); C23C 16/54 (2013.01); C23C 16/545 (2013.01)

(58) Field of Classification Search
None
See application file for complete search history.

(56) References Cited

U.S. PATENT DOCUMENTS

| | | | |
|---|---|---|---|
| 4,389,973 A | 6/1983 | Suntola et al. | |
| 8,043,432 B2 | 10/2011 | Dip | |
| 2004/0097022 A1* | 5/2004 | Werkhoven | ....... H01L 21/76262 438/149 |
| 2007/0049054 A1* | 3/2007 | Ahn | ........................ H01L 29/78 257/E29.345 |
| 2008/0261412 A1* | 10/2008 | Yoon | .................. C23C 16/45551 438/785 |
| 2009/0081883 A1* | 3/2009 | Freeman | ........... C23C 16/45553 438/765 |
| 2010/0221426 A1* | 9/2010 | Sferlazzo | .......... C23C 16/45551 118/724 |
| 2011/0023775 A1 | 2/2011 | Nunes et al. | |

(Continued)

OTHER PUBLICATIONS

Online definition of "traverse" https://www.merriam-webster.com/dictionary/traverse#:~:text=%3A%20to%20pass%20through%2C%20across%2C,a%20bridge%20traverses%20the%20river (Year: 2023).*

(Continued)

*Primary Examiner* — Mandy C Louie
(74) *Attorney, Agent, or Firm* — FOLEY & LARDNER LLP

(57) ABSTRACT

A temporal Atomic Layer Deposition system and method utilizing precursor pulses applied to a moving substrate. The precursor pulses are self-exhausting.

7 Claims, 15 Drawing Sheets

(56) References Cited

U.S. PATENT DOCUMENTS

| | | | |
|---|---|---|---|
| 2011/0262628 A1* | 10/2011 | Sferlazzo | H01L 31/0322 427/124 |
| 2011/0268879 A1 | 11/2011 | Granneman et al. | |
| 2012/0141676 A1* | 6/2012 | Sershen | C23C 16/4412 118/729 |
| 2012/0225204 A1* | 9/2012 | Yudovsky | C23C 16/54 427/248.1 |
| 2013/0280918 A1* | 10/2013 | Ahmed | H01L 21/02532 438/763 |
| 2014/0053779 A1* | 2/2014 | Martinson | C23C 16/52 118/723 R |
| 2014/0273514 A1* | 9/2014 | Somervell | G03F 7/40 438/763 |
| 2015/0031157 A1* | 1/2015 | Elam | C23C 16/45544 438/46 |
| 2015/0096495 A1* | 4/2015 | Jeong | C23C 16/45565 118/729 |
| 2018/0158688 A1* | 6/2018 | Chen | H01L 21/28568 |
| 2018/0309166 A1* | 10/2018 | Yersak | H01M 10/054 |

OTHER PUBLICATIONS

Beneq, "WCS 500 Web Coating System for Roll-to-Rolle ALD," 2 pages (2012).

Granneman, et al., "High-throughput, in-line ALD Al2O3 system," 25th European Photovoltaic Solar Energy Conference, 4 pages (2010).

Groner, "Gas diffusion barriers on polymers using Al2O3 atomic layer deposition," Applied Physics Letters 88, 051907, 3 pages (2006).

Kools, High Throughput Atomic Layer Deposition for Encapsulation of Large Area Electronics, ECS Transactions 41(2), pp. 195-201 (2011).

Levy, et al., "Stable ZnO thin film transistors by fast open air atomic layer deposition," Applied Physics Letters 92, 192101, 3 pages (2008).

Maydannik, et al., "An atomic layer deposition process for moving flexible substrates," Chemical Engineering Journal 171, pp. 345-349 (2011).

Poodt, et al., "High-Speed Spatial Atomic-Layer Deposition of Aluminum Oxide Layers for Solar Cell Passivation," Advanced Materials 22(32), pp. 3564-3567 (2010).

Solaytec, "Ultrafast, spatial ALD," 2 pages (2012).

Yanguas-Gil & Elam, "Analytic expressions for atomic layer deposition: Coverage, throughput, and materials utilization in cross-flow, particle coating, and spatial atomic layer deposition," Journal of Vacuum Science & Technology A 32, 031504, 8 pages (2014).

* cited by examiner

Fig. 6A                    Fig. 6B

12 Hz timing (msec)
15 – 25 – 15 – 25 DEZ/H2O

20 Hz
50 sec deposition time

20 Hz timing (msec)
10 – 15 – 10 – 15 DEZ/H2O

ATOMIC LAYER DEPOSITION FOR CONTINUOUS, HIGH-SPEED THIN FILMS

CROSS-REFERENCE TO RELATED APPLICATIONS

The present application claims priority to U.S. Prov. App. Ser. No. 62/553,107 filed Aug. 31, 2017 and incorporated herein by reference.

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

Embodiments described herein relate generally to deposition, more particularly Atomic Layer Deposition ("ALD").

BACKGROUND

A core technical problem facing a range of clean energy industries is the need for a continuous process to deposit precise thin film coatings. This coating process must be rapid, inexpensive, and versatile. For instance, high-performance moisture permeation barriers and robust transparent conducting ("TC") layers could revolutionize the manufacturing of photovoltaics, solid state lighting, and electrochromic windows.

Atomic Layer Deposition ("ALD") is a thin film coating technology that provides atomic-level control over thickness and composition, and superb conformality over complex surfaces. Based on these attributes, ALD has been successfully integrated into the high volume manufacturing of microelectronics. ALD has been shown to deposit exceptional moisture barriers and TC layers. However, limitations in existing ALD equipment and processing restrict ALD to the manufacturing of high-value items such as microelectronics. ALD holds tremendous promise in applications far removed from microelectronics and could revolutionize nanomanufacturing in a broad range of energy technologies, including photovoltaics, solid state lighting, lithium batteries, and catalyst manufacturing. However, a major barrier to the commercialization of ALD technology in these fields is the need to speed up the throughput by 10-100× and to transition from batch- to continuous-processing. Currently we are restricted to conventional ALD, performed in a vacuum on static substrates in a "batch" mode, and this is incompatible with continuous manufacturing lines. A continuous, high-speed ALD processing, which is only beginning to emerge, will be critical to bringing ALD into the energy technology marketplace.

ALD uses sequential, alternating exposures to precursor vapors A and B that react individually on a substrate surface and deposit material in an atomic layer-by-layer fashion. The precursors are typically mixed with a carrier gas to aid in delivery to the substrate and controlled delivery to the reactor. The carrier gas may be selected to be non-reactive with the precursor, the substrate, and/or the purge case. Additional sequences of precursors may be used to either modify the deposited atomic layer or despite further atomic layers. Traditionally, the substrate is stationary, and each A and B exposure occurs in a vacuum chamber that must be purged between exposures. A purge gas is typically used after each precursor application to clear the reactor of the precursor gas before introduction of the next precursor in the sequence. ALD techniques may utilize subcycles and supercycles of precursor application to achieve desired layers, thickness of layers, relative thickness between different components, and/or doping of a layer. The stationary substrate and the vacuum and purging requirements make ALD prohibitively slow and incompatible with manufacturing in many applications, such as the energy industries.

One attempt to address this failure of ALD systems and techniques has been development of continuous ALD tools that utilize "spatial ALD." The spatial ALD approach uses inert gas curtains or barriers to separate zones of continuously fed precursors, such as A and B precursors. Thus, each precursor gas is physically restricted to a region. Typically, a moving substrate passes through these A and B regions to execute the ALD cycles. For instance, Lotus Applied Technology has made a prototype roll-to-roll system for depositing aluminum oxide barrier layers on polymer films. Levitech and SoLayTec are both manufacturing high throughput spatial ALD systems for applying aluminum oxide passivation layers on silicon photovoltaics. Both of these companies derived from research in spatial ALD at the TNO institute in Finland. In addition, Kodak has also made a prototype spatial ALD system very similar to the Levitech system. All of these existing systems suffer from a number of limitations. The Lotus device is only suitable for flexible substrates and therefore cannot address the needs of the glass, battery, and catalyst industries. The Levitech, SoLayTec, and Kodak tools require extremely tight tolerances in the substrate-tool gap height, and this makes them unsuitable for coating non-planar substrates such as powders. Finally, all of these devices are designed around the aluminum oxide ALD process, and attempts to deposit other materials have been mostly unsuccessful and prevent their deployment in the range of industries listed above.

SUMMARY

Embodiments described herein relate generally to a method for ALD, comprising the steps of providing a moving reaction surface and performing a cycle of atomic layer deposition. A cycle of atomic layer deposition comprises: dispensing a first precursor A pulse to the moving reaction surface; reacting the first precursor A pulse with the reaction surface to exhaust the first precursor A pulse; dispensing a first precursor B pulse to the moving reaction surface to deposit material; and reacting the first precursor B pulse with the deposited material A on the reaction surface to exhaust the first precursor B pulse. Finally, the method includes forming a thin film layer on the substrate.

Another embodiment relates to a method for continuous thin film processing by ALD. The method includes the steps of moving a substrate along a substrate travel path from a first roll to a second roll; flowing a carrier gas over the substrate; and performing a first atomic layer deposition cycle. The atomic layer deposition cycle includes: dispensing a first pulse of precursor A to an injector; dispensing the first pulse of the precursor A from the injector into a laminar flow of carrier gas on the substrate; adsorbing the first pulse of precursor A with the substrate to exhaustion to form a plurality of reactive sites; dispensing a first pulse of precursor B to an injector; dispensing the first pulse of the precursor B from the injector into a laminar flow of carrier gas on the substrate; and reacting the first pulse of precursor B with the plurality of reactive sites to exhaustion to form a deposited thin film layer.

Another embodiment relates to a system for performing atomic layer deposition. The system comprises a moving bed including a reaction surface. A first precursor source is configured to provide a pulse of a first precursor. A second precursor source is configured to provide a pulse of a second precursor. A carrier gas source is provided. A first injector is in communication with the first precursor source, the second precursor source, and the carrier gas source. The first injector has a plurality of nozzles, each associated with one of the first precursor source and the second precursor source and configured to direct respective first precursor pulse or second precursor pulse to a laminar flow zone associated with the reaction surface.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 6A illustrates the results using a high speed Fujikin valve for 0.5 Hz deposition using TMA and $H_2O$ as precursors. The timing of the introduction of the A and B reactants is such that they do not coexist in the reactor at the same time, thus maintaining the requirements of an ALD process. FIG. 6B illustrates the results using a high speed Fujikin valve for 1.0 Hz deposition using TMA and $H_2O$ as precursors. In FIGS. 6B, A and B do coexist in the reactor at the same time with a resultant CVD-like behavior.

FIG. 10A illustrates experimental results for one embodiment at 1.06 torr; FIG. 10B illustrates experimental results for one embodiment at 0.92 torr; FIG. 10C illustrates experimental results for one embodiment at 0.78 torr; FIG. 10D illustrates experimental results for one embodiment at 0.55 torr; FIG. 10E illustrates experimental results for one embodiment at 1.07 torr with cycle spacing at 5 cm; FIG. 10F illustrates experimental results for one embodiment at 1.07 torr with cycle spacing at 3 cm and 20 Hz with a 50 second deposition time.

FIG. 13A illustrates the slowest test at 0.63 Hz. FIG. 13B illustrates a test at 0.89 Hz. FIG. 13C illustrates a test at 2.0 Hz. FIG. 13D illustrates a test at 3.13 Hz. FIG. 13E illustrates a test at 4.17 Hz.

Figure 1:
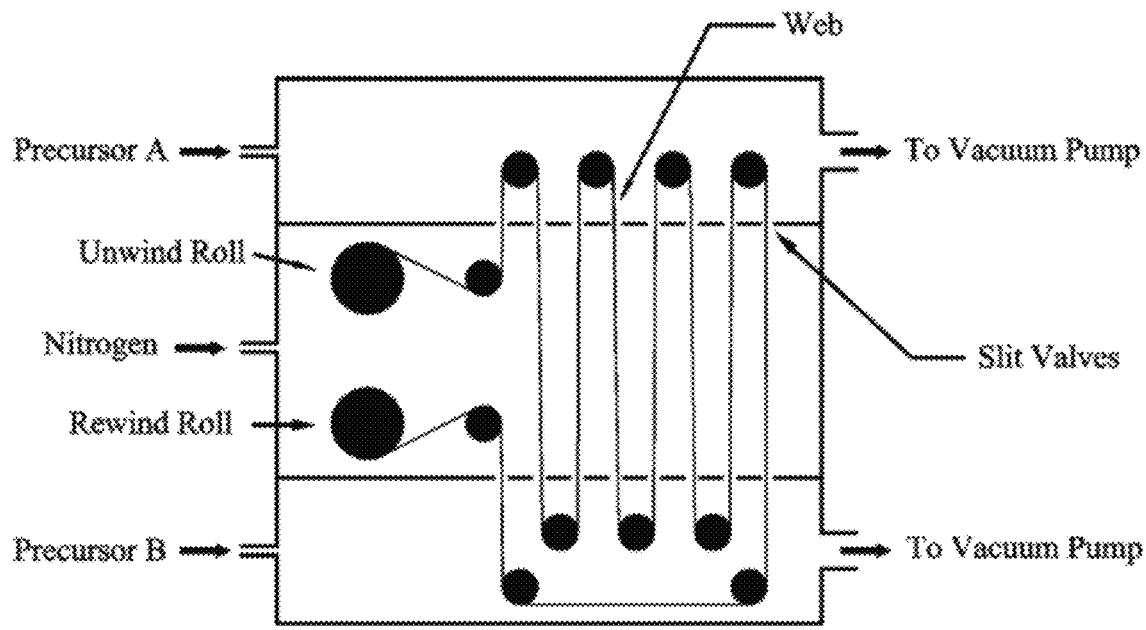
FIG. 1 illustrates a prior art roll-to-roll system.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the Figs., can be arranged, substituted, combined, and designed in a wide variety of different configurations, all of which are explicitly contemplated and made part of this disclosure.

DETAILED DESCRIPTION OF VARIOUS EMBODIMENTS

Figure 2A:
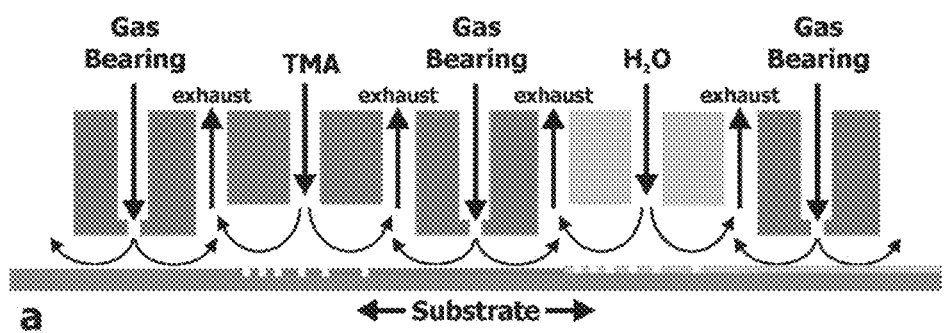
FIG. 2A illustrates a line-view of a prior art spatial ALD process.
Figures 2B, 2C:
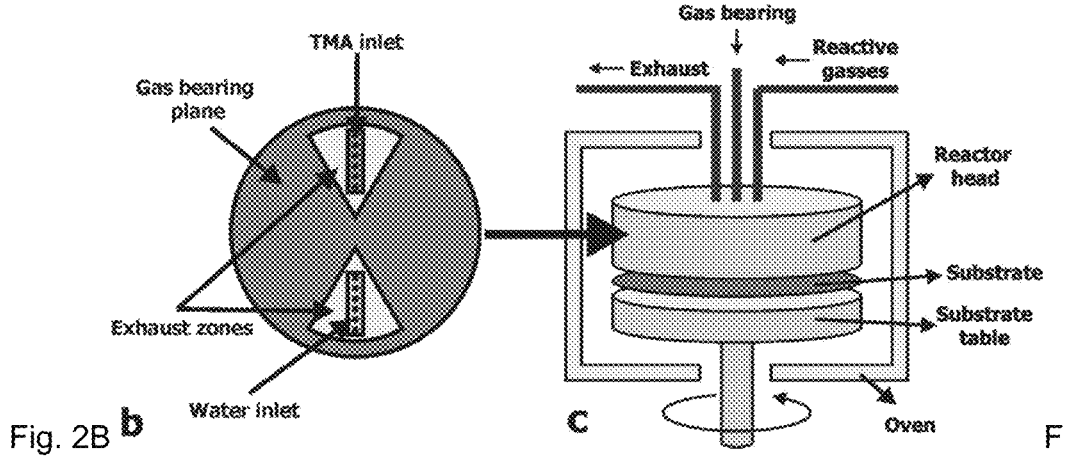
FIG. 2B illustrates a top view of a rotating assembly for spatial ALD.
FIG. 2C illustrates a perspective view of a rotating spatial ALD system.

Prior ALD approaches, as outlined above, which relied on a physical (i.e., spatial) separation for application, reaction, and purge of a precursor, as shown in FIGS. 2A-C, for example. Further, while it is desirable to avoid the slow growth times for prior art ALD systems, it is also desirable to avoid Chemical Vapor Deposition-like behavior and to continue to exhibit ALD behavior such as ALD is self-terminating surface reactions and linear film thickness growth (per cycle).

Figure 4A:
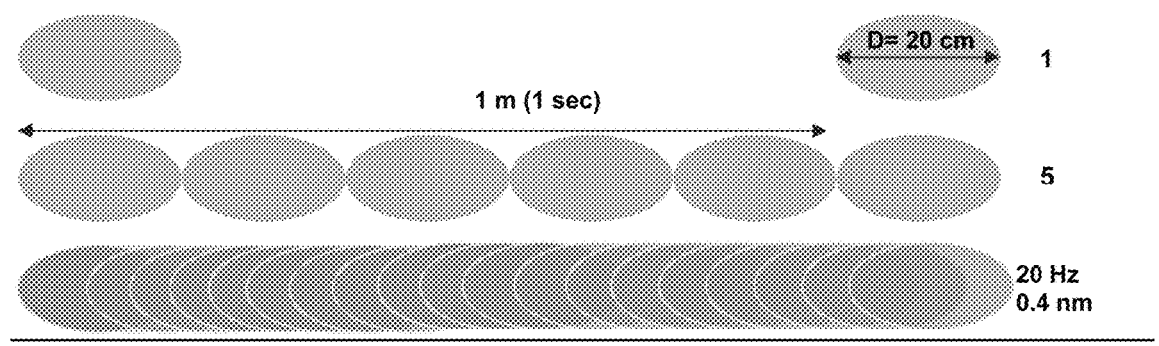
FIG. 4A illustrates a comparison of a single ALD cycle (1 Hz) vs a series of parallel depositions at 5 Hz and overlapping depositions at 20 Hz.
Figure 4B:
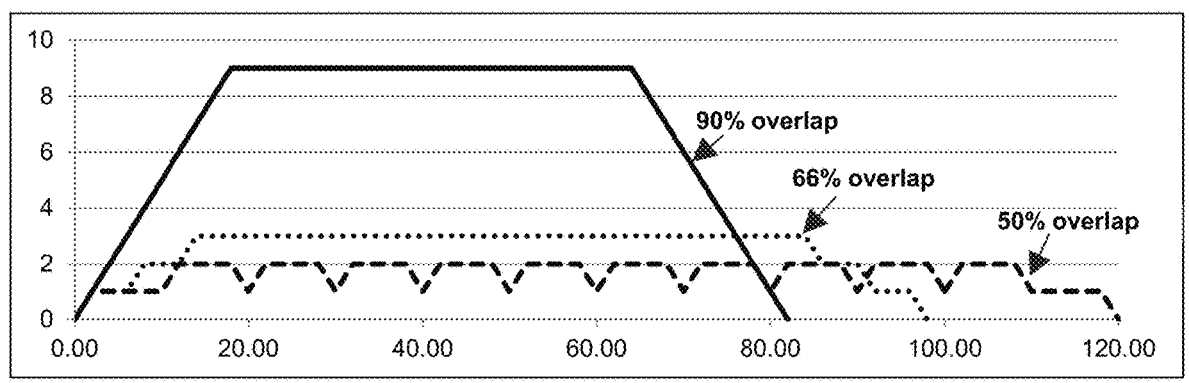
FIG. 4B graphically depicts the overlap for each scenario in FIG. 4A.

To overcome limitations of the current ALD approach presently described are methods and systems using a "temporal ALD" approach rather than the "spatial" approach of the prior art. FIG. 4A illustrates a comparison of a single ALD cycle (1 Hz) vs a series of parallel depositions at 5 Hz and overlapping depositions at 20 Hz. FIG. 4B graphically depicts the overlap for each scenario in FIG. 4A. As can be seen, the ability to deposit concurrently provides much higher throughput for a given time. In some embodiments, systems, and methods are provided for a type of "temporal" ALD using very fast precursor pulses with very short purges between. The A and B precursors are injected from the same physical location. In some embodiments, the dose and purge times depend on (a) proximity of the A and B injectors, (b) reactor pressure, and (c) axial velocity of the carrier gas. The guiding principle is each injection of a chemical must react with the surface until all of the pulse is consumed by surface reaction before any of it can contact with a subsequent co-reactant injection. It is possible to have multiple A and B pulses in the reactor at a given time where they are kept separated by the axial transport down the reactor with diffusion preventing mixing of the chemical pulse fronts. In one embodiment, the wait time is long enough (high purge time) before permitting the next pulse. In the other extreme, an embodiment uses a very high velocity to sweep the pulse axially down the reactor with 0 time purge.

This temporal ALD allows very high deposition rates on a moving substrate through a short reaction zone. The A and B precursors are added sequentially to an inert carrier gas stream in such a way as to coat a finite portion of the substrate and completely consume the entirety of the precursor in the pulse. Thus, in some embodiments the precursor pulses are "self-extinguishing" pulses and the system and methods use moving substrates.

Figure 3A:
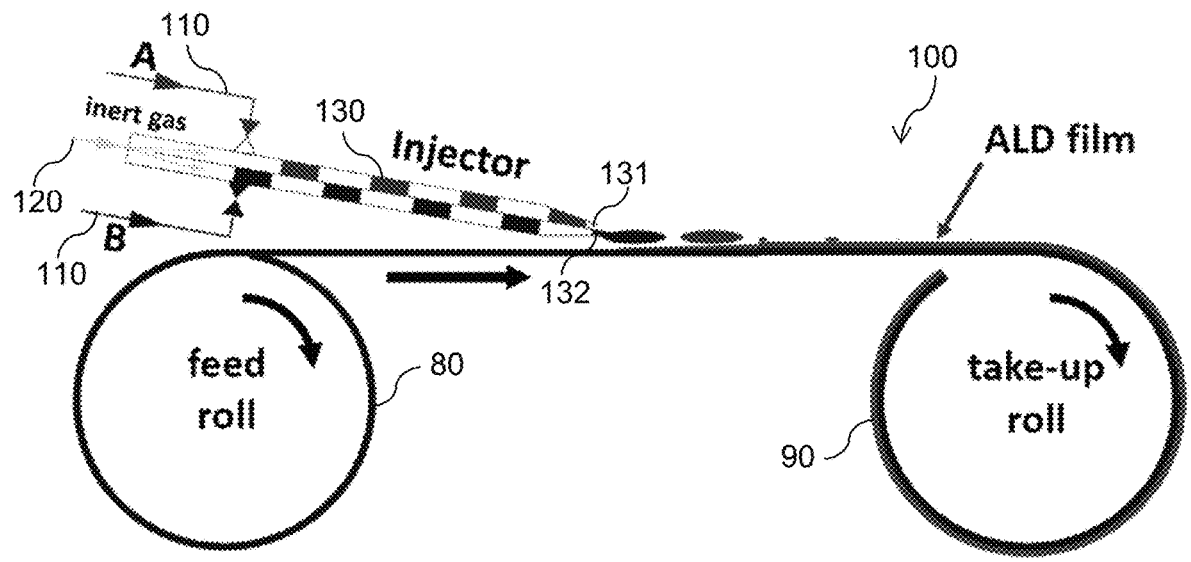
FIG. 3A illustrates one embodiment of a roll-to-roll ALD system.
Figure 3B:
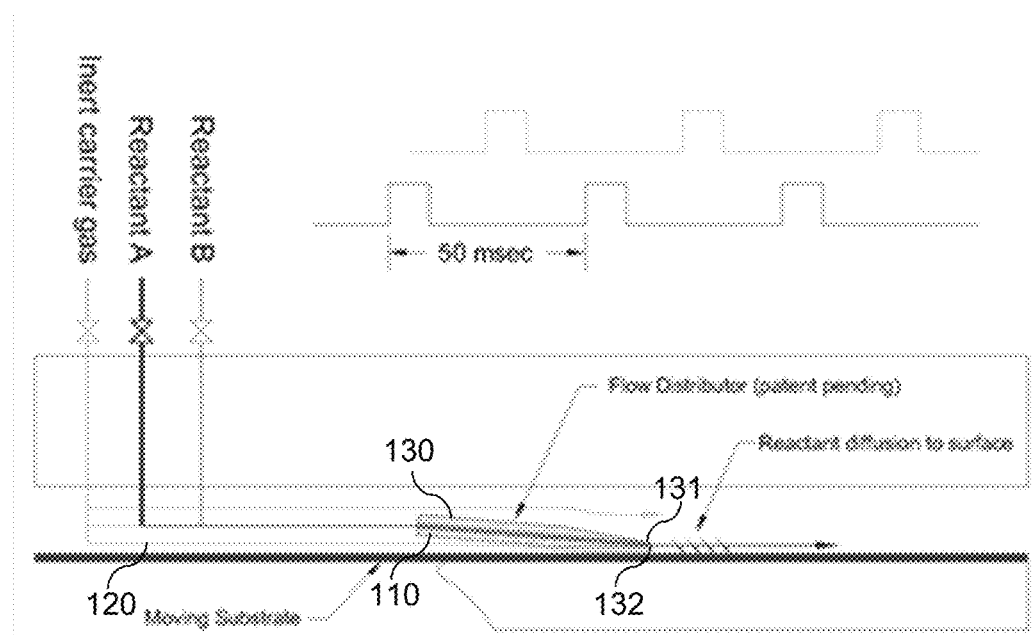
FIG. 3B illustrates a side-view of a temporal ALD system.

FIGS. 3A and 3B illustrate one embodiment of an ALD system 100. As shown in FIG. 3A, a source of precursors 110 (illustrated as two precursors, A and B). A feed roll 80 and a take-up roll 90 may be used for roll-to-roll implementation. An inert gas source 120 is also provided. The inert gas source 120 may be split into separate lines associated with each precursor or may be provided in the form of multiple separate gas sources 120 (not shown). The carrier gas and precursors are directed through an injector 130 to be deposited on the film. The injector 130 may comprise a single structure that includes separated pathways for each precursor or may be structurally separate nozzles 131, 132. The nozzles 131, 132 deposit the respective precursor on the substrate, such as a film. Each nozzle deposits a small amount of precursor (provided with a carrier case, typically) followed by a purge gas, effectively resulting in a short pulse of precursor.

In one embodiment, the injection of chemical pulses is controlled by a simple opening and closing of a valve connecting the injector tip and the reactant reservoir. However, in practical implementation the volumes of the tubing and fittings are on the order of the volumes of the desired injections so that managing the dead volumes becomes important to consider. Thus, in one embodiment, a "high speed virtual valve" is used. In this setup, flow reversal in the injector tip is used to assure that the dead volumes did not interfere with the formation of well-defined pulse cutoffs (as in FIG. 9). This is slightly wasteful of precursor. The conceptual dosing scheme in FIG. 12 eliminates this waste.

Figure 5A:
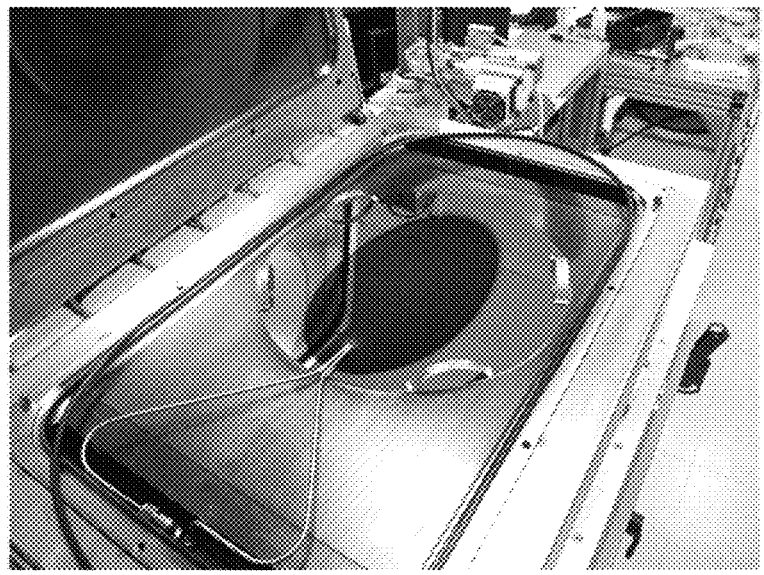
FIG. 5A illustrates one embodiment of a self-extinguishing pulse.
Figure 5B:
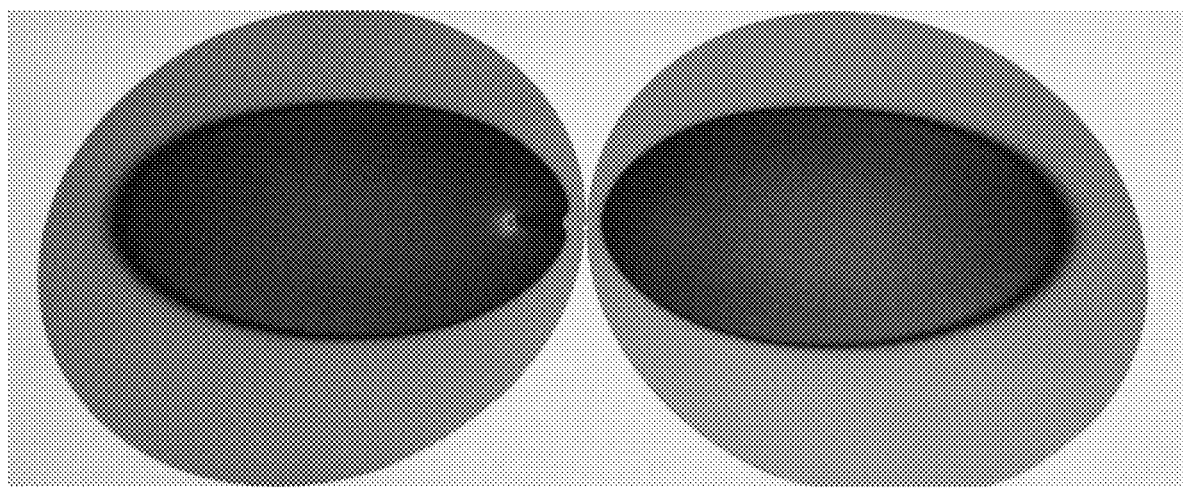
FIG. 5B illustrates another embodiment of a self-extinguishing pulse.
Figure 5C:
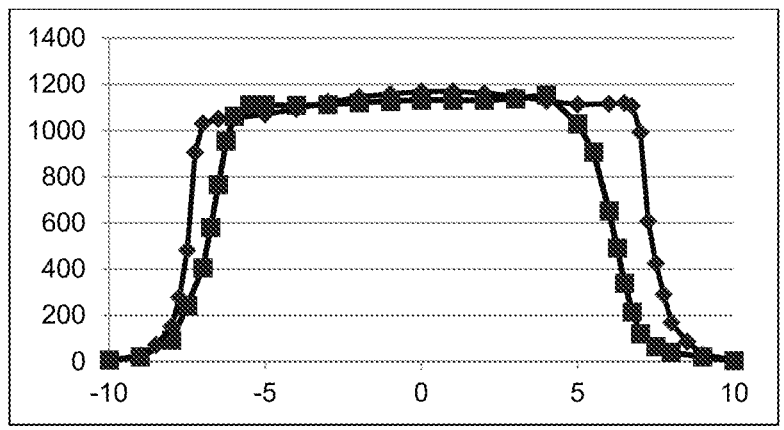
FIG. 5C illustrates transverse thickness profiles in terms of angstrom per ALD cycle relative to the ALD inlet location. The trace with closed squares in FIG. 5D was measured at the Y=10 cm location while the trace with closed diamonds was measured at the Y=2 cm location.
Figure 5D:
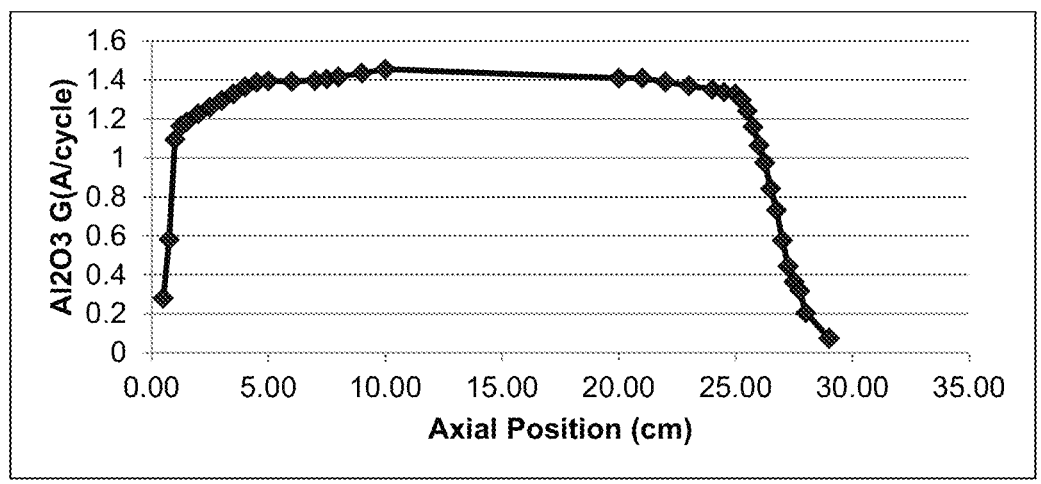
FIG. 5D illustrates an axial thickness profile in terms of angstrom per ALD cycle relative to the ALD inlet location.

In one embodiment, each of these pulses is "self-extinguishing". Self-extinguishing means that with local injection of a precursor (which is a reactant) in close proximity to the moving substrate in such a way as to coat a finite portion of the substrate and be completely consume the entirety of the reactant in the pulse. Extinguishing means the precursor has been depleted or exhausted through reaction. For example, the pulse is less than the amount to saturate such that the precursor is extinguishes over a finite spatial extent such that the overlap of the spatial extent of adjacent injectors provides a way to complete coat the moving substrate with satisfactory uniformity. The precursors, which may be more than two, but for simplicity the examples herein primarily will refer to two precursors, are sequentially injected such that the prior precursor has extinguished (i.e., completely reacted). This allows very high deposition rates on a moving substrate through a short reaction zone. The self-extinguishing element of this approach is that the self-extinguishing reactant exposures eliminate any downstream interaction of the A and B reactants to greatly reduce the purge requirements and minimizing precursor consumption. FIG. 5A illustrates one embodiment of a self-extinguishing pulse. FIG. 5B illustrates another embodiment of a self-extinguishing pulse. FIG. 5C illustrates transverse thickness profiles in terms of angstrom per ALD cycle relative to the ALD inlet location. The trace with closed squares in FIG. 5D was measured at the Y=10 cm location while the trace with closed diamonds was measured at the Y=2 cm location. FIG. 5D illustrates an aizial thickness profile in terms of angstrom per ALD cycle relative to the ALD inlet location. The fall-off in deposition thickness is indicative of the precursor exhausting from completely reacting with the substrate.

In one embodiment, a purge gas is provided between each pulse of a precursor. The purge gas may be the same as the carrier gas for the precursor or may be different gas. Further, the carrier gas may be provided to the substrate through a separate carrier gas flow distributor. In one embodiment, the carrier gas is injected at the front of the reactor to form a bulk flow across the entire volume of the reactor (see, e.g., FIG. 3B). The reactant pulses are injected locally at the tips of the injector.

Figure 8A:
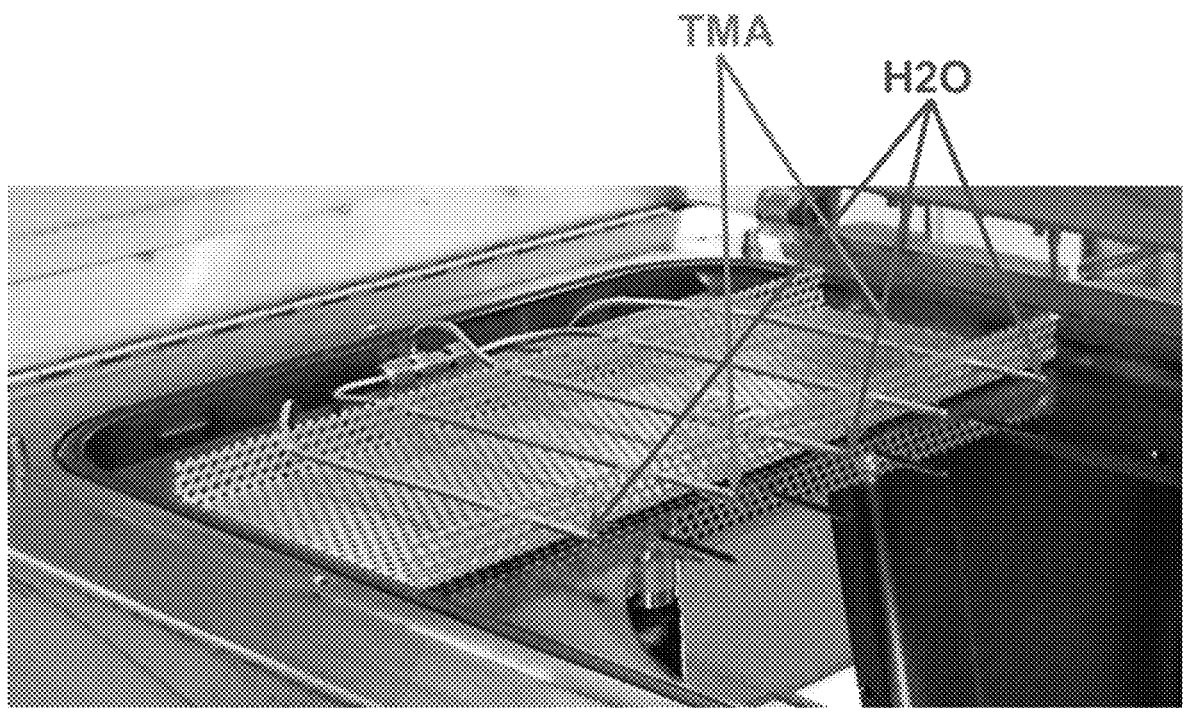
FIG. 8A illustrates a multiple injector nozzle setup.
Figure 8B:
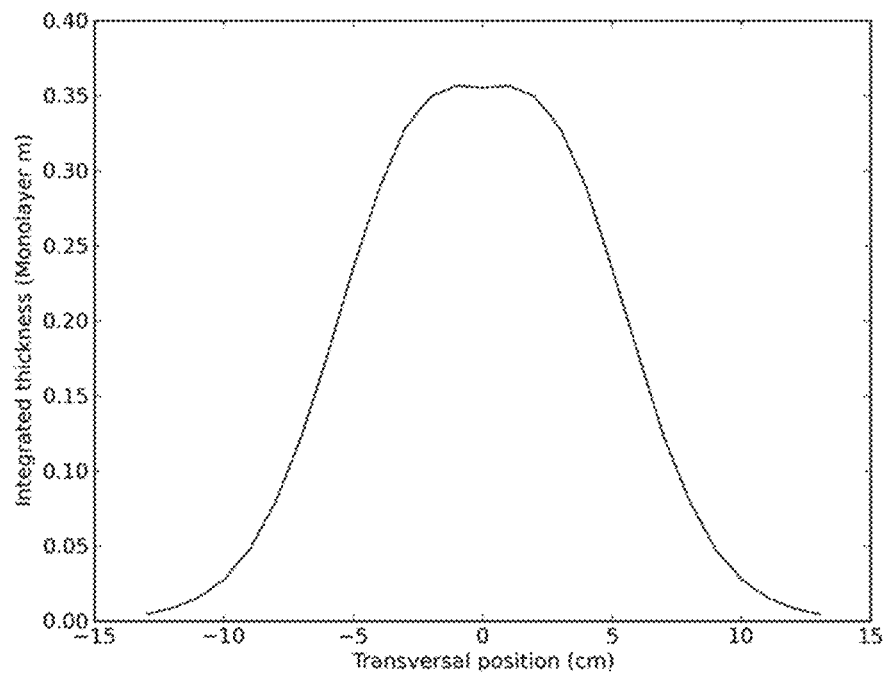
FIG. 8B illustrates growth using 5 injectors for 3 ALD cycles with the nozzles arranged as WTWTW (precursors TMA and $H_2O$).
Figure 8C:
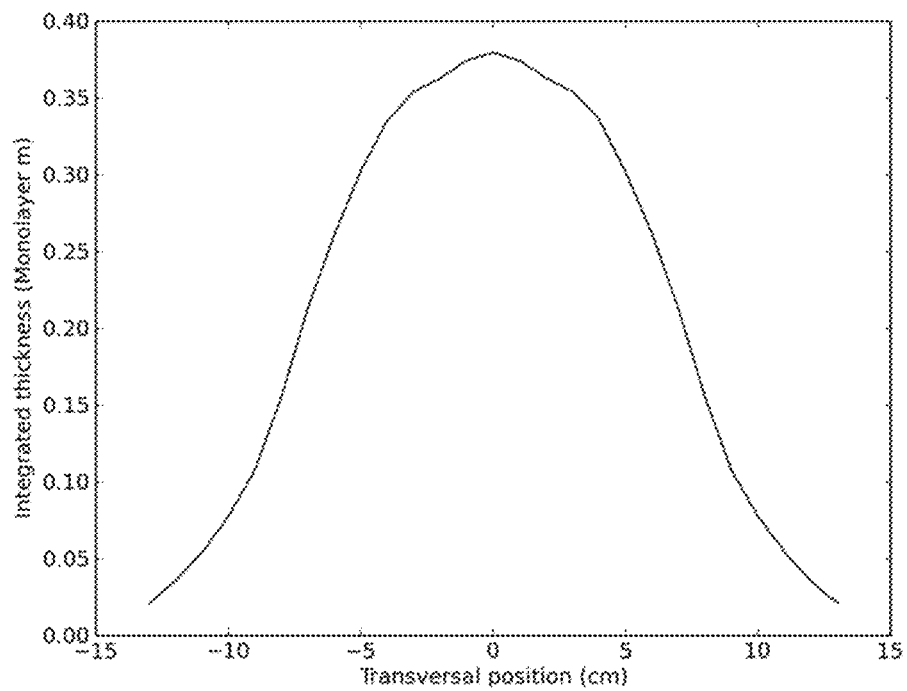
FIG. 8C illustrates growth using 5 injectors for 3 ALD cycles with the nozzles arranged as TWTWT (precursors TMA and $H_2O$).

Each nozzle is configured to deliver the respective precursor pulse into the laminar flow stream (of the carrier gas) very near to the surface of the moving substrate. A single or multiple nozzles may be provided for each precursor. In further embodiments, a system and methods utilize temporal ALD may have a plurality of nozzles. Thus, while the system of FIG. 3A is illustrated with one nozzle associated with precursor A and one nozzle associated with precursor B, each precursor may be dispensed from one or more nozzles. The nozzles may be arranged in an alternating arrangement. In one embodiment, there are an odd number of nozzles and the metal precursor for the ALD reaction has one more nozzle for distribution. In an alternative embodiment, there are an odd number of nozzles and the reducing precursor for the ALD reaction has one more nozzle for distribution such as shown in FIG. 8A. FIG. 8A illustrates a multiple injector nozzle setup. The spacing between nozzles is 0 to 4 inches, such as greater than 0 to 4 inches; in one particular embodiment, it is 2 inches. FIG. 8B illustrates growth using 5 injectors for 3 ALD cycles with the nozzles arranged as WTWTW (precursors TMA and $H_2O$). FIG. 8C illustrates growth using 5 injectors for 3 ALD cycles with the nozzles arranged as TWTWT (precursors TMA and $H_2O$). As can be see, the relative location of the injectors associated with each precursor can be altered to control the growth profile of the deposited layer.

Figure 9:
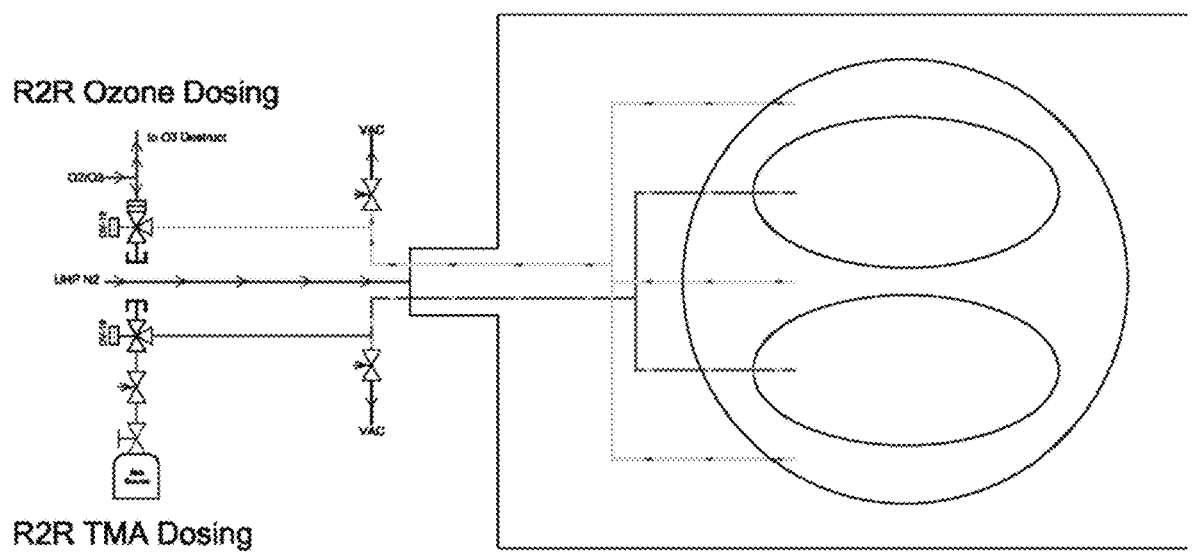
FIG. 9 illustrates a simplified valve scheme.

FIG. 9 illustrates a simplified valve scheme having five nozzles. This setup was used for the examples noted below. The system of FIG. 9 results in two growth zones that vary based on the system's parameters as shown in FIGS. 10-A-

Figure 12:
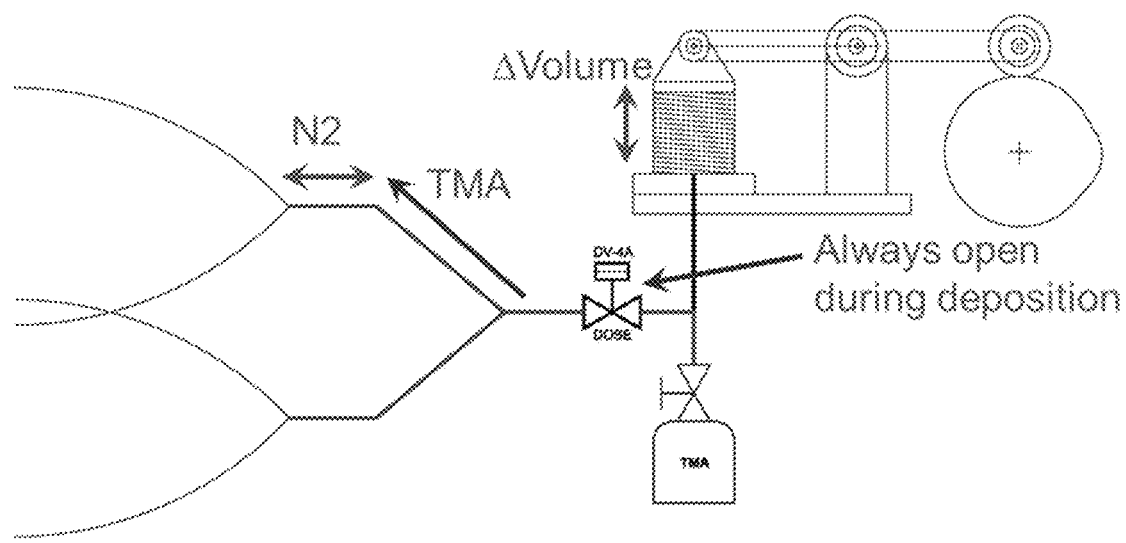
FIG. 12 illustrates one embodiment of a valve arrangement.

10F. FIG. 12 illustrates one embodiment of a valve arrangement. The system of FIG. 12 uses a cam-operated variable volume is being considered to create pulsed delivery of pure reagent. Carrier gas is drawn into the delivery tubes during the purge part of the cycle—this is a commonly use principle of a virtual valve. Lifetime of reciprocating bellows is ~$10^8$ cycles or ~133 8-hour cycles. Notably, this scheme provides for a zero-waste operation whereas trying to deploy vacuum valves to reverse the flow cannot be zero waste.

A key element of this approach is that the self-extinguishing reactant exposures minimize or eliminate any downstream interaction of the precursors with each other to achieve near complete or complete utilization of the reactants, and to greatly reduce the purge requirements. Testing indicates that the completes of the reaction is demonstrated by confirmation through a mass spectrometer that TMA was not detectable at the outlet of the reactor. Another observation is that no film growth of any kind was observed downstream of the growth zone. Also, a zero value of thickness provides evidence of extinction of the reactants. Another key element is the very short reaction zone that will permit atmospheric operation.

Target Level of Performance

Based on our extensive experience in ALD reactor design we anticipate an increase in the deposition rate of 10-100× compared to existing commercial equipment.

In one embodiment, A is overdosed and then B is dosed less so that B is extinguished but some A flow out of the reactor. The reverse could also be done with B overdosed and A reduced.

The deposition rate will depend on the substrate translation speed and the coverage of a single, self-extinguishing pulse. For example, if self-extinguishing, 20 Hz pulses cover 1.0 m of a substrate traveling at 1 m/sec, then the deposition thickness will be 20 ALD cycles, or approximately 2.0 nm of film. Given that the deposition length will require approximately 1 m, a further increase in the deposition rate can be achieved by repeating the basic processing unit, at 1 per meter. In one embodiment, the target for ALD cycle time of is 20 Hz on a substrate moving at ~100 cm/sec at atmospheric pressure in order to achieve a 2-200 nm ALD film in a single pass. The direction of substrate movement can be opposite that of the carrier case. However, it will tend to drag the reactants upstream requiring higher purge times.

In order to avoid a "half deposit," where only half of the deposition is on the film and the other is on the reactor (such as the static roof), a roll-to-roll film returns along the top side of the reactor or otherwise two films are simultaneously coated both moving with the flow, one at the top and one at the bottom.

Experimental Results

Figure 7A:
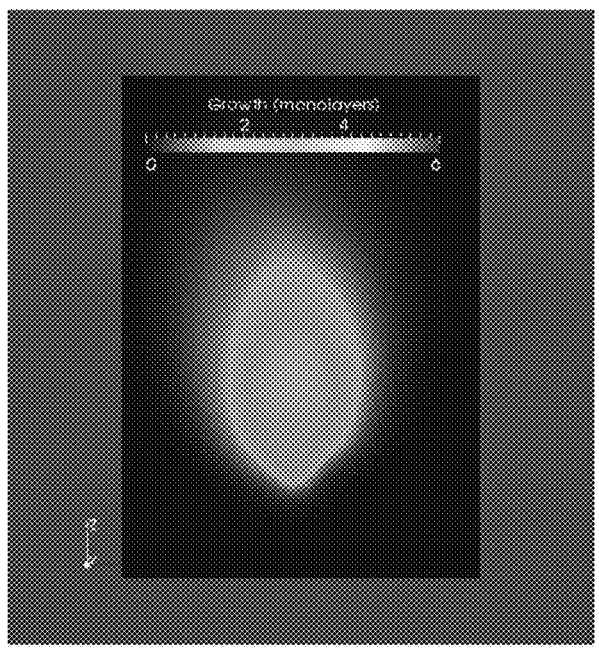
FIG. 7A illustrates a software-modeled ALD deposition for 4.17 Hz deposition using TMA and $H_2O$ as precursors.
Figure 7B:
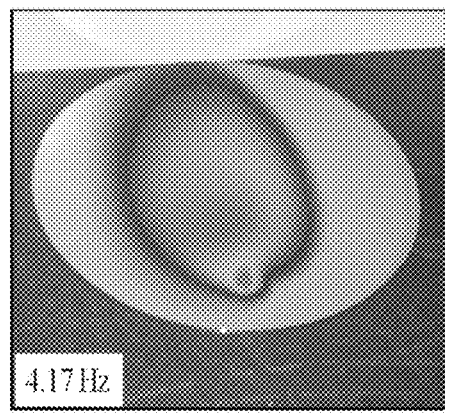
FIG. 7B illustrates a real-world ALD deposition for 4.17 Hz deposition using TMA and $H_2O$ as precursors.

FIG. 7A illustrates a software-modeled ALD deposition for 4.17 Hz deposition using TMA and $H_2O$ as precursors; FIG. 7B illustrates a real-world ALD deposition for 4.17 Hz deposition using TMA and $H_2O$ as precursors. As can be seen, the real-world deposition closely matches that predicted by the software.

Figures 10A, 10B, 10C, 10D:
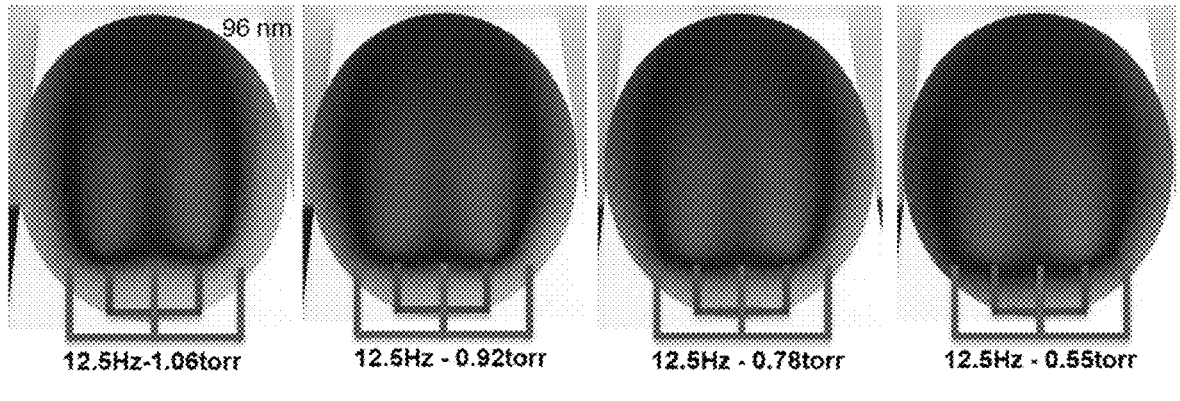
FIGS. 10A-10F illustrate experimental results at 12.5 Hz for ZnO deposition using 10-15-10-15 cycled DEZ/$H_2O$ with 1000 cycle runs and a 200 nm nominal.
Figures 10E, 10F:
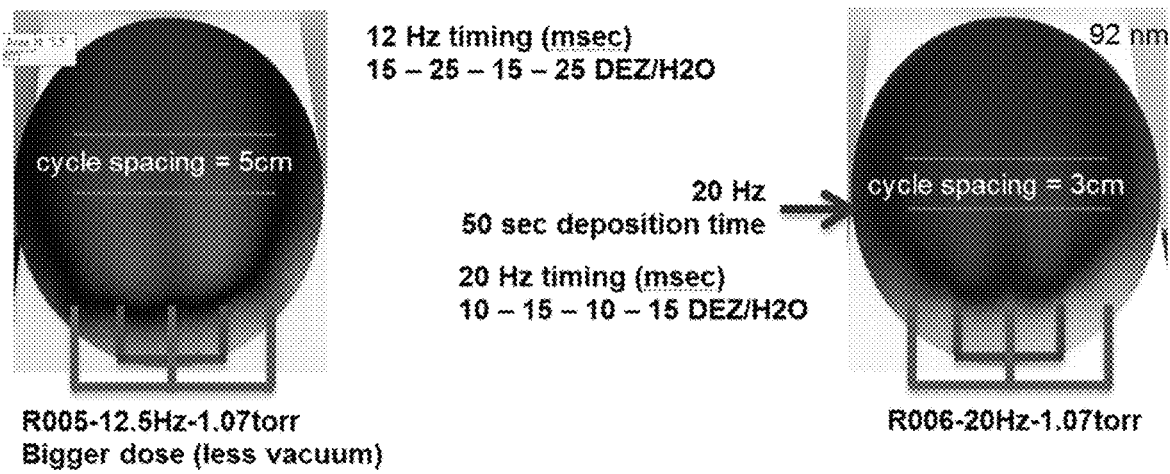

FIGS. 10A-F illustrate experimental results at 12.5 Hz for ZnO deposition using 10-15-10-15 cycled DEZ/$H_2O$ with 1000 cycle runs and a 200 nm nominal: FIG. 10A illustrates experimental results for one embodiment at 1.06 torr; FIG. 10B illustrates experimental results for one embodiment at 0.92 torr; FIG. 10C illustrates experimental results for one embodiment at 0.78 torr; FIG. 10D illustrates experimental results for one embodiment at 0.55 torr; FIG. 10E illustrates experimental results for one embodiment at 1.07 torr with cycle spacing at 5 cm; FIG. 10F illustrates experimental results for one embodiment at 1.07 torr with cycle spacing at 3 cm and 20 Hz with a 50 second deposition time.

Figures 11A, 11B:
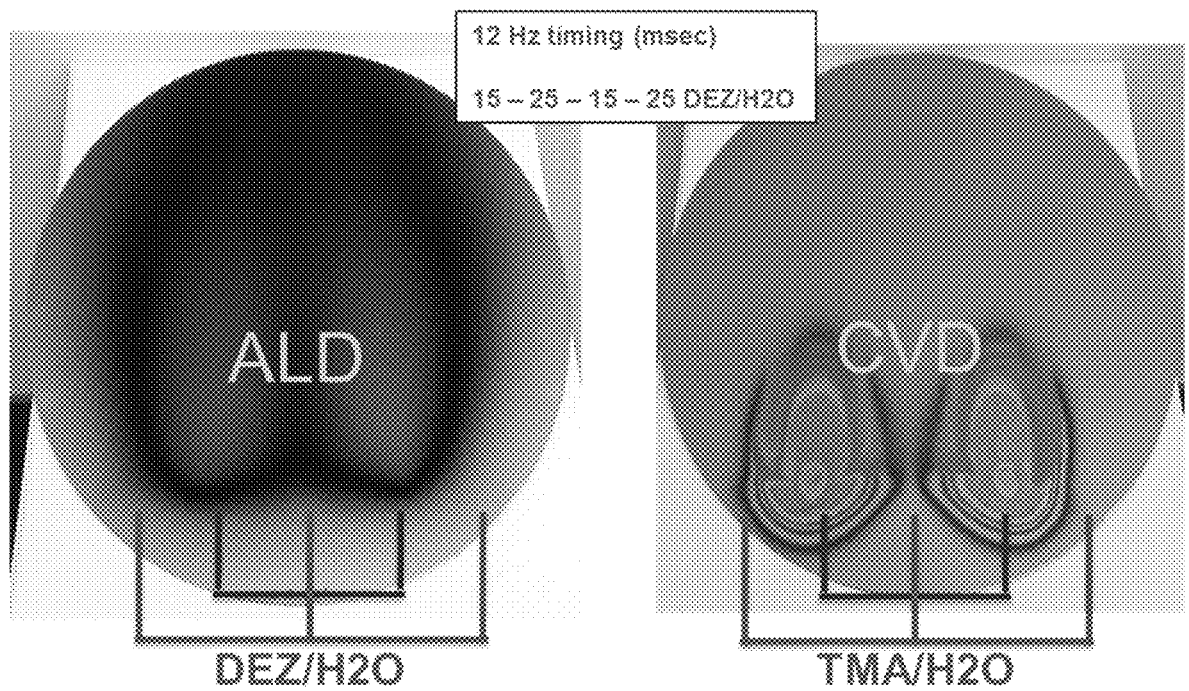
FIG. 11A illustrates a ALD deposition in accordance with one embodiment for DEZ/$H_2O$ precursor deposition of ZnO.
FIG. 11B illustrates deposition via CVD using TMA/$H_2O$ precursors. The experiments of FIGS. 11A and 11B were run at the same valve settings and timings.

FIG. 11A illustrates a ALD deposition in accordance with one embodiment for DEZ/$H_2O$ precursor deposition of ZnO; FIG. 11B illustrates deposition via CVD using TMA/$H_2O$ precursors. The experiments of FIGS. 11A and 1B were run at the same valve settings and timings. It is believed the difference in diffusivity TMA>>DEZ causes excessive TMA/$H_2O$ mixing—CVD. The high TMA diffusivity needs to be counteracted for high speed: Higher pressure carrier gas and higher axial velocity=bigger pump.

Figure 6C:
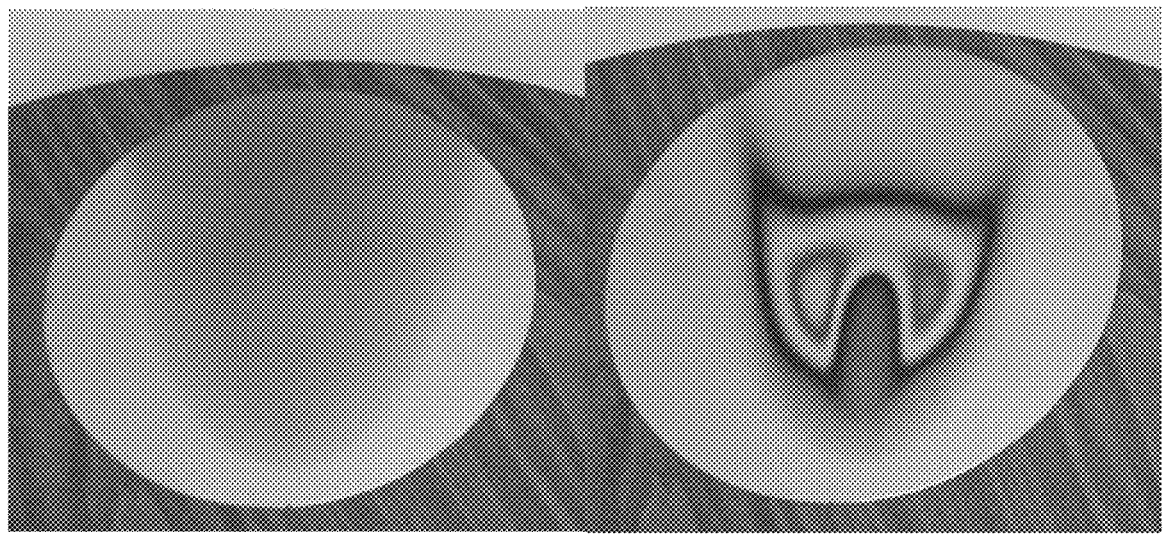
FIG. 6C is a graph of thickness versus location.
Figure 6C:
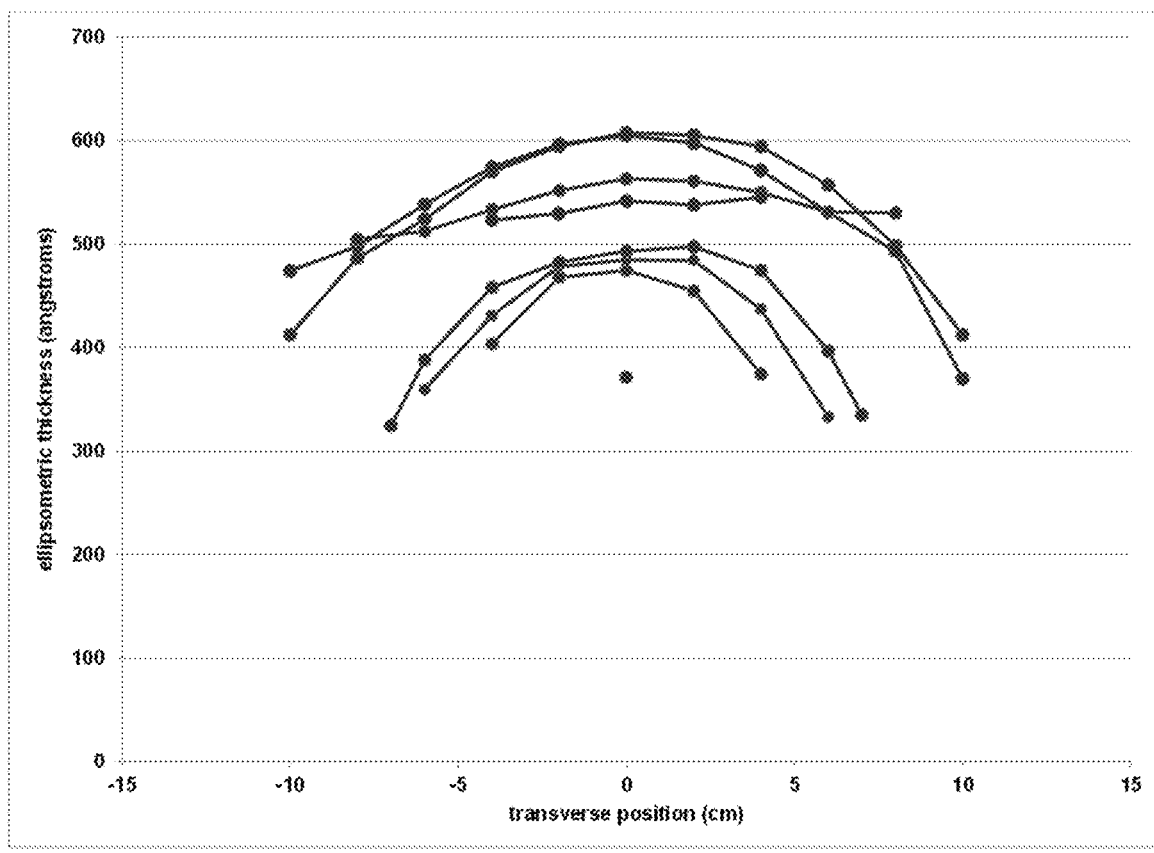

FIG. 6A illustrates the results using a high speed Fujikin valve for 0.5 Hz deposition using TMA and $H_2O$ as precursors. FIG. 6B illustrates the results using a high speed Fujikin valve for 1.0 Hz deposition using TMA and $H_2O$ as precursors. FIG. 6C is a graph of thickness versus location.

Figure 13A:
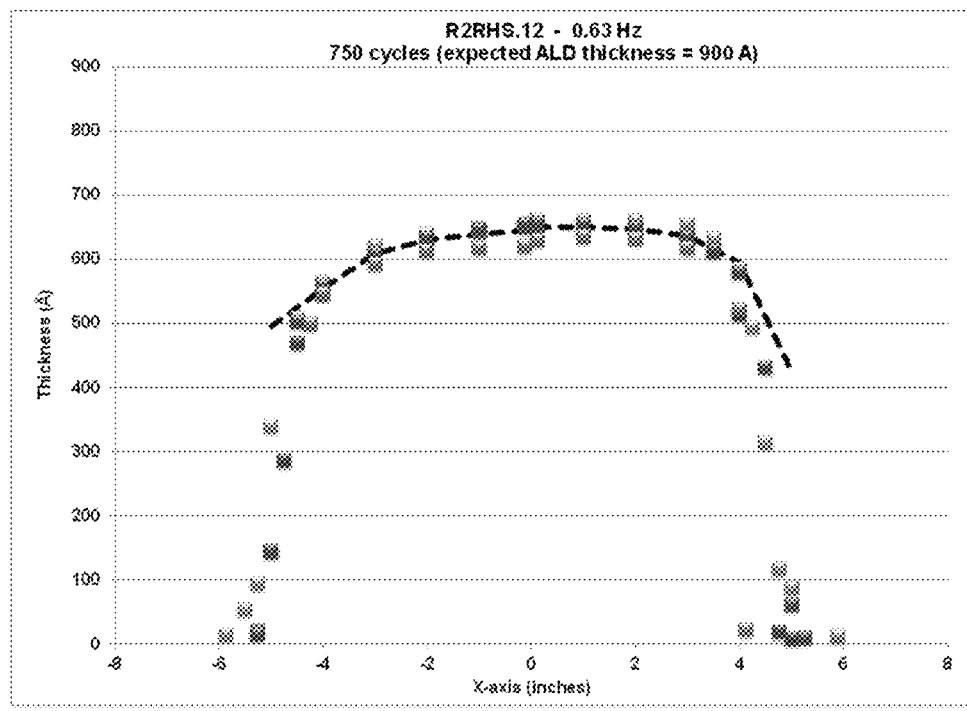
FIGS. 13A-13E illustrate a series of speed trials for ALD deposition according to one embodiment, deposition utilized TMA and $H_2O$ precursors for 750 cycles providing an expected thickness of 900 Angstrom.
Figure 13B:
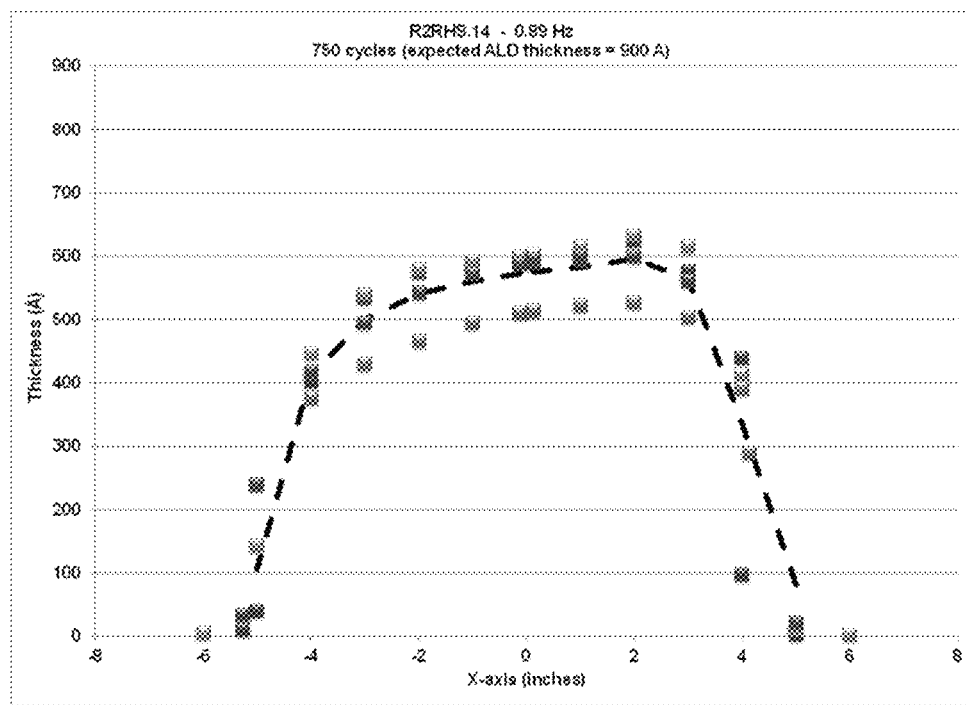
Figure 13C:
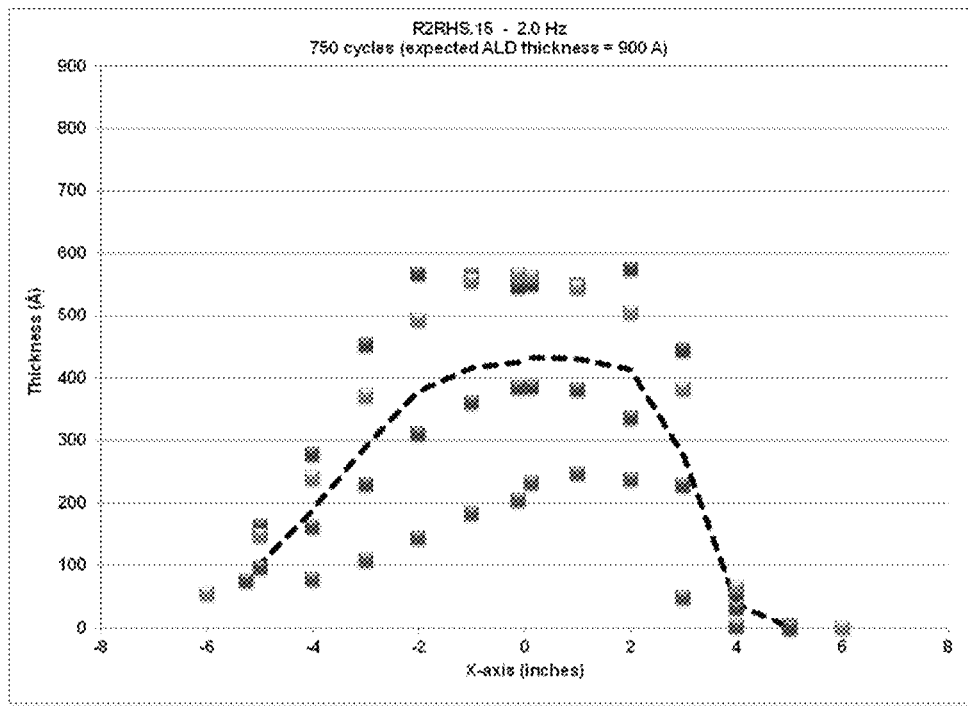
Figure 13D:
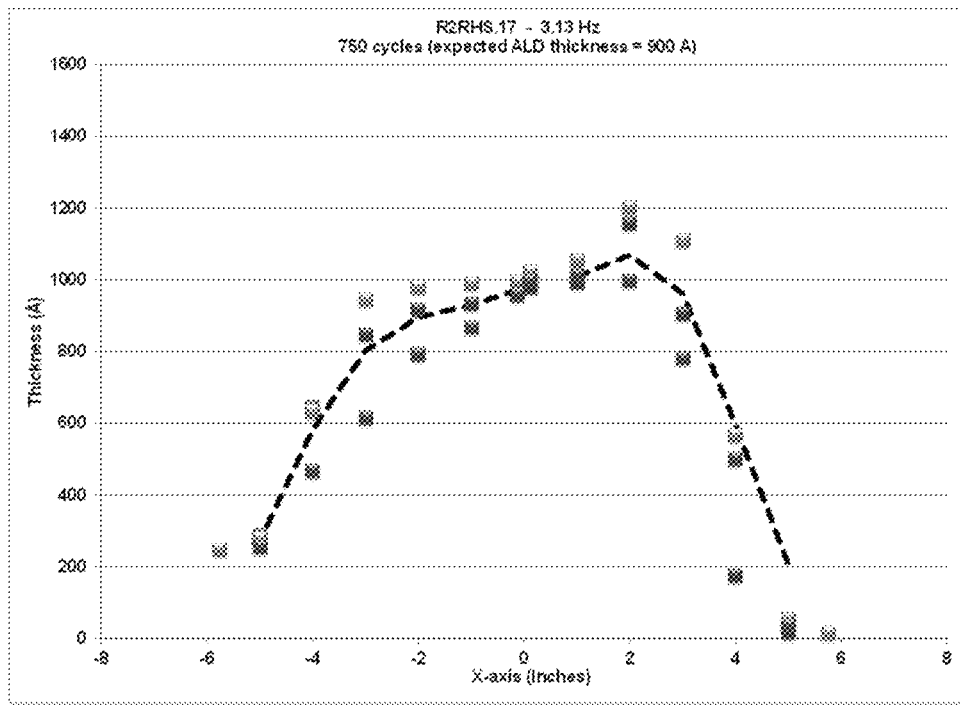
Figure 13E:
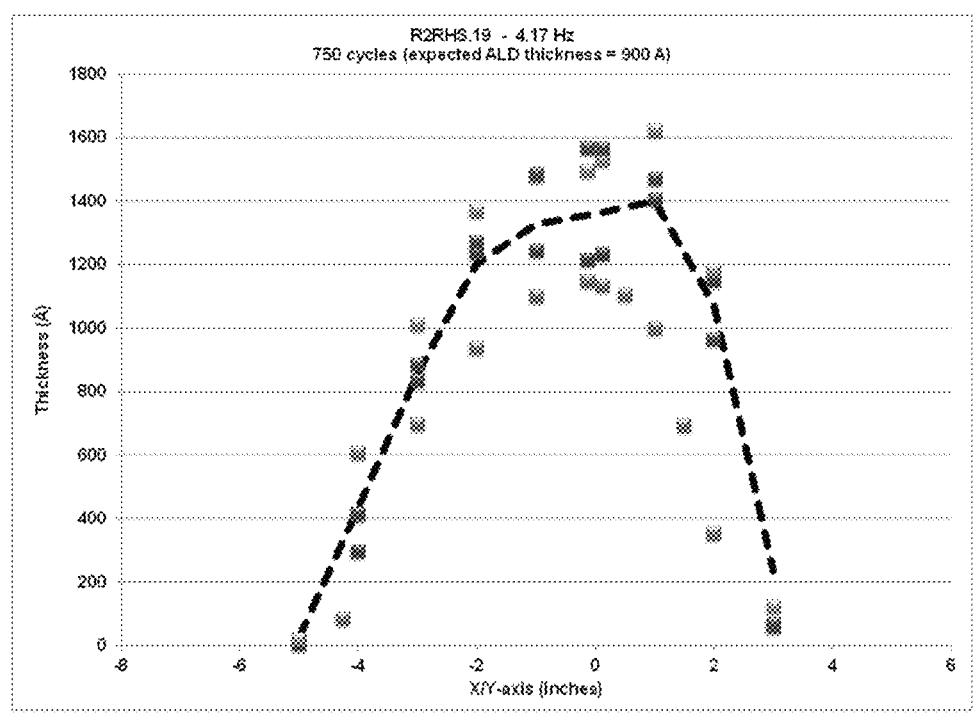

FIGS. 13A-E illustrate results from a speed trial. FIG. 13A illustrates the slowest test at 0.63 Hz and ALD-like saturation was observed but with 20% smaller deposition rate than expected. FIG. 13B illustrates a test at 0.89 Hz. The approach to saturation was observed to be less due to sub-cooling in the reagent reservoirs. FIG. 13C illustrates a test at 2.0 Hz. FIG. 13D illustrates a test at 3.13 Hz with a higher temperature resulting in a higher vapor pressure. Saturation was obtained, thought a bias towards the water-injector is visible. FIG. 13E illustrates a test at 4.17 Hz with a temperature resulting in a higher vapor pressure. The largest bias towards the water injector is observed as well as the onset of a CVD component in the deposition rate.

Further, the systems and methods described herein can be utilized in some embodiments for web coating applications. For example, with a deposition time of no greater than 80 sec for 100 nm film and a deposition rate of 100 nm at 0.23 cm/sec=1 nm at 23 cm/sec=4 nm at 6 cm/sec. In some further embodiments, a barrier film may be formed by at 6 cm/sec.

Definitions

As used herein, the singular forms "a," "an," and "the" include plural referents unless the context clearly dictates otherwise. Thus, for example, the term "a member" is intended to mean a single member or a combination of members and "a material" is intended to mean one or more materials or a combination thereof.

As used herein, the terms "about" and "approximately" generally mean plus or minus 10% of the stated value. For example, about 0.5 would include 0.45 and 0.55, about 10 would include 9 to 11, and about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes, and omissions may also be made in the design, operating conditions, and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method for continuous thin film processing by atomic layer deposition, comprising the steps of:
    moving a substrate along a substrate travel path from a feed roll to a take-up roll;
    flowing a carrier gas over the substrate; and
    performing a first atomic layer deposition cycle by:
        dispensing a first pulse of precursor A to a plurality of precursor A injectors;
        dispensing the first pulse of the precursor A from the plurality of precursor A injectors into a laminar flow of carrier gas on the substrate;
        adsorbing the first pulse of precursor A with the substrate to exhaustion to form a plurality of reactive sites;
        dispensing a first pulse of precursor B to a plurality of precursor B injectors, the plurality of precursor B injectors arranged in an alternating arrangement transverse the substrate travel path with the plurality of precursor A injectors with one more precursor B injector than precursor A injector;
        dispensing the first pulse of the precursor B from the precursor B injector into a laminar flow of carrier gas on the substrate; and
        reacting the first pulse of precursor B with the plurality of reactive sites to exhaustion to form a deposited thin film layer;
        wherein the first pulse and the second pulse are alternately dispensed at a frequency of at least 5 Hz and further wherein the first pulse is self-extinguishing and the second pulse is self-extinguishing.

2. The method of claim 1, further comprising forming the thin film layer by atomic layer deposition at a rate of at least 20 Hz.

3. The method of claim 1, further comprising performing a second additional atomic layer deposition cycle after completion of the first cycle by:
    dispensing a second pulse of precursor A to an injector;
    dispensing the second pulse of the precursor A from the injector into a laminar flow of carrier gas on the substrate;
    adsorbing the second pulse of precursor A with the substrate to exhaustion to form a plurality of reactive sites;
    dispensing a second pulse of precursor B to an injector;
    dispensing the second pulse of the precursor B from the injector into a laminar flow of carrier gas on the substrate; and
    reacting the second pulse of precursor B with the plurality of reactive sites to exhaustion to form a deposited thin film layer.

4. A method for continuous thin film processing by atomic layer deposition, comprising the steps of:
    moving a substrate along a substrate travel path from a feed roll to a take-up roll;
    flowing a carrier gas over the substrate; and
    performing a first atomic layer deposition cycle by:
        dispensing a first pulse of precursor A to an injector;
        dispensing the first pulse of the precursor A from the injector into a laminar flow of carrier gas on the substrate;
        adsorbing the first pulse of precursor A with the substrate to exhaustion to form a plurality of reactive sites;
        dispensing a first pulse of precursor B to the injector;
        dispensing the first pulse of the precursor B from the injector into a laminar flow of carrier gas on the substrate; and
        reacting the first pulse of precursor B with the plurality of reactive sites to exhaustion to form a deposited thin film layer;
    wherein dispensing the first pulse of precursor A and dispensing the first pulse of precursor B are temporally separated.

5. The method of claim 4, wherein dispensing the first pulse of precursor A to the injector comprises dispensing the first pulse of precursor A to a first pathway in the injector;
    wherein dispensing the first pulse of precursor B to the injector comprises dispensing the first pulse of precursor B to a second pathway in the injector; and
    wherein the first pathway is separate from the second pathway.

6. The method of claim 1, wherein each precursor A injector of the plurality of precursor A injectors has a distance from each precursor B injector of the plurality of precursor B injectors of about 0 inches to 4 inches.

7. The method of claim 1, wherein flowing the carrier gas over the substrate comprises dispensing the carrier gas on the substrate along the substrate travel path before the plurality of precursor A injectors and the plurality of precursor B injectors.

* * * * *